(12) United States Patent
Lu et al.

(10) Patent No.: US 9,892,948 B2
(45) Date of Patent: Feb. 13, 2018

(54) WAFER CONTAINER HAVING DAMPING DEVICE

(71) Applicant: Taiwan Semiconductor Manufacturing Co., Ltd., Hsinchu (TW)

(72) Inventors: Hung-Jen Lu, Hsinchu (TW); Ming-Hsien Lee, Zhubei (TW); Chih-Hung Huang, Tainan (TW); Chuan-Pu Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/176,557

(22) Filed: Jun. 8, 2016

(65) Prior Publication Data
US 2017/0358471 A1    Dec. 14, 2017

(51) Int. Cl.
*H01L 21/673* (2006.01)
(52) U.S. Cl.
CPC .... *H01L 21/67369* (2013.01); *H01L 21/6732* (2013.01)
(58) Field of Classification Search
CPC ...... B65D 85/30; B65D 81/113; B65D 85/48; H01L 21/673; H01L 21/6732; H01L 21/67369

USPC ....... 206/710, 711, 723; 211/41.18
See application file for complete search history.

(56) References Cited

U.S. PATENT DOCUMENTS

| | | | | |
|---|---|---|---|---|
| 6,811,029 B2* | 11/2004 | Eggum | ............. | H01L 21/67383 206/710 |
| 7,131,176 B2* | 11/2006 | Eggum | ............. | H01L 21/67383 211/41.18 |
| 7,201,276 B2* | 4/2007 | Burns | ............... | H01L 21/67369 206/710 |
| 8,857,619 B1 | 10/2014 | Yang et al. | | |
| 9,184,077 B2 | 11/2015 | Yang et al. | | |
| 2016/0196993 A1* | 7/2016 | Nagashima | ....... | H01L 21/67369 206/710 |
| 2016/0280443 A1* | 9/2016 | Nagashima | .......... | B65D 81/113 |

* cited by examiner

*Primary Examiner* — Bryon Gehman
(74) *Attorney, Agent, or Firm* — McClure, Qualey & Rodack, LLP

(57) ABSTRACT

A wafer container is provided. The wafer container includes a pod base having a top surface and a bottom surface, a cassette disposed on the top surface, and a damping device, disposed on the bottom surface. The damping device includes a housing disposed in the pod base, and a damping mechanism disposed in the housing and protruding over the bottom surface. The damping mechanism is configured to provide a damping force.

20 Claims, 7 Drawing Sheets

WAFER CONTAINER HAVING DAMPING DEVICE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a wafer, and patterning the various material layers using a lithography process to form circuit components and elements thereon. Many integrated circuits are typically manufactured on a single wafer, and individual dies on the wafer are singulated by sawing between the integrated circuits along a scribe line. The individual dies are typically packaged separately, in multi-chip modules, or in other types of packaging, for example.

In the semiconductor industry, wafers are frequently transported to different semiconductor apparatuses for different semiconductor manufacturing processes. Wafers are often transported in wafer containers to protect them from pollution and damage when the wafers are not processed by semiconductor apparatuses.

Although existing wafer containers have generally been adequate for their intended purposes, they have not been entirely satisfactory in all respects. Consequently, it would be desirable to provide a solution for improving the wafer containers.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1:
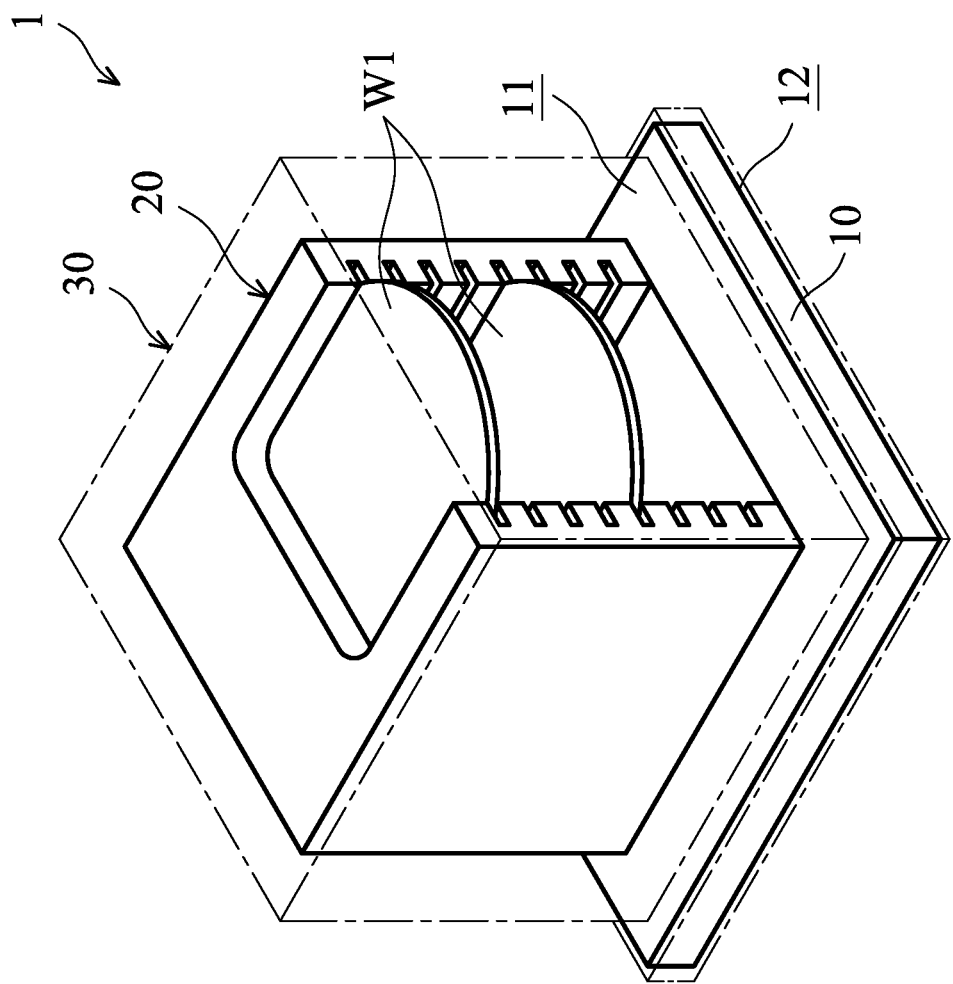
FIG. 1 is a perspective view of a wafer container in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

A wafer container with shock-absorption function is provided. The wafer container is configured to receive wafers. The wafer container protects the wafers from pollution and damage. Moreover, the wafer container is configured to be transported to or loaded on different semiconductor apparatuses to convey wafers to different semiconductor manufacturing tool locations for various fabrication processes.

In some embodiments, the semiconductor apparatus includes a chemical mechanical polishing (CMP) apparatus, a physical vapor deposition (PVD) apparatus, a chemical vapor deposition (CVD) apparatus, an ion implant apparatus, an epitaxy apparatus, a sputter apparatus, a thermal processing apparatus, an etching apparatus, a photolithography apparatus, or other suitable apparatuses.

In some embodiments, the semiconductor manufacturing process is a chemical mechanical polishing (CMP) process, a physical vapor deposition (PVD) process, a chemical vapor deposition (CVD) process, an atomic layer deposition (ALD), a doping process, a screen printing process, a dry etching process, a wet etching process, a photolithography, or other suitable processes.

In general, the wafer container may be put on an apparatus, such as a handcart, allowing it to be transported between semiconductor apparatuses. The wafer container may further be loaded on an apparatus, such as a semiconductor apparatus, when the wafers are processed by a semiconductor apparatuses.

When the wafer container is transported between and/or loaded on/off the apparatuses, physical impacts there-between may generate shocks to the wafer container, which may damage the wafers received therein. The impact shock to the wafer container may be reduced by the shock-absorption function. Therefore, damage to the wafers in the wafer container due to shock is decreased.

Figure 2:
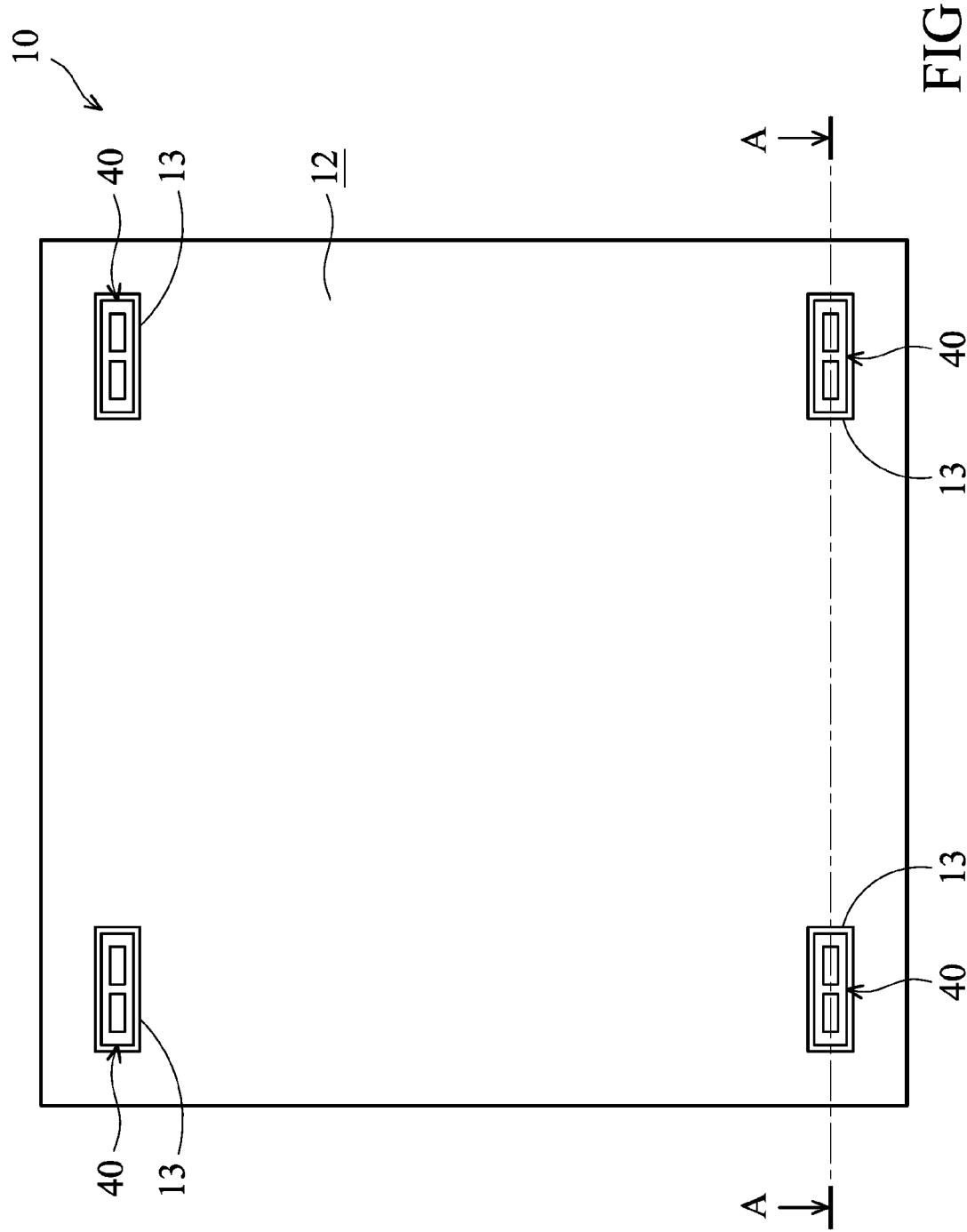
FIG. 2 is a top view of the pod base in accordance with some embodiments of the disclosure.

FIG. 1 is a perspective view of a wafer container 1 in accordance with some embodiments of the disclosure. FIG. 2 is a top view of a pod base 10 of the wafer container 1 in accordance with some embodiments of the disclosure. The wafer container 1 is configured to receive wafers W1. In some embodiments, the wafer container 1 is a wafer pod, a front opening unified pod (FOUP), a wafer lot, a wafer cassette, or a wafer boat.

The wafer generally comprises a circular plate/disc structure. The diameter of the wafer is in a range from about 150 mm to about 450 mm. In some embodiments, the wafer W1 is a semiconductor substrate including silicon (in other words, a silicon wafer). Alternatively or additionally, the wafer W1 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. In yet another alternative, the wafer is a semiconductor on insulator (SOI).

The wafer container 1 includes a pod base 10, a cassette 20, a pod shell 30, and damping devices 40. In some embodiments, the pod base 10 is a pod door. The pod base 10 is a plate structure, and has a top surface 11 and a bottom surface 12. The cassette 20 is disposed on the top surface 11 of the pod base 10. The cassette 20 is configured to contain wafers W1.

In some embodiments, the maximum number of wafers W1 contained by the cassette 20 is in a range from about 10 to about 25. The number of wafers W1 contained by the cassette 20 is in a range from about 1 to about 25. The wafers W1 contained by the cassette 20 are parallel to each other.

The pod shell 30 is detachably disposed on the top surface 11 of the pod base 10, and configured to cover the cassette 20. In some embodiments, the pod shell 30 is configured to prevent the wafer W1 from escaping from the cassette 20. In some embodiments, the pod shell 30 is transparent. The pod shell 30 prevents the particles, which are out of the wafer container 1, from falling onto the wafers W1.

The damping devices 40 are disposed on the bottom surface 12 of the pod base 10. The damping devices 40 are located at the corners of the pod base 10. The damping devices 40 are configured to provide damping forces for protecting the wafer W1 in the wafer container 1, as shown in FIG. 1, from shocking.

In some embodiments, receiving grooves 13 are formed on the bottom surface 12 of the pod base 10. The receiving grooves 13 are located at the corners of the bottom surface 12. The damping devices 40 are fixed in the receiving grooves 13 of the pod base 10.

Figure 3:
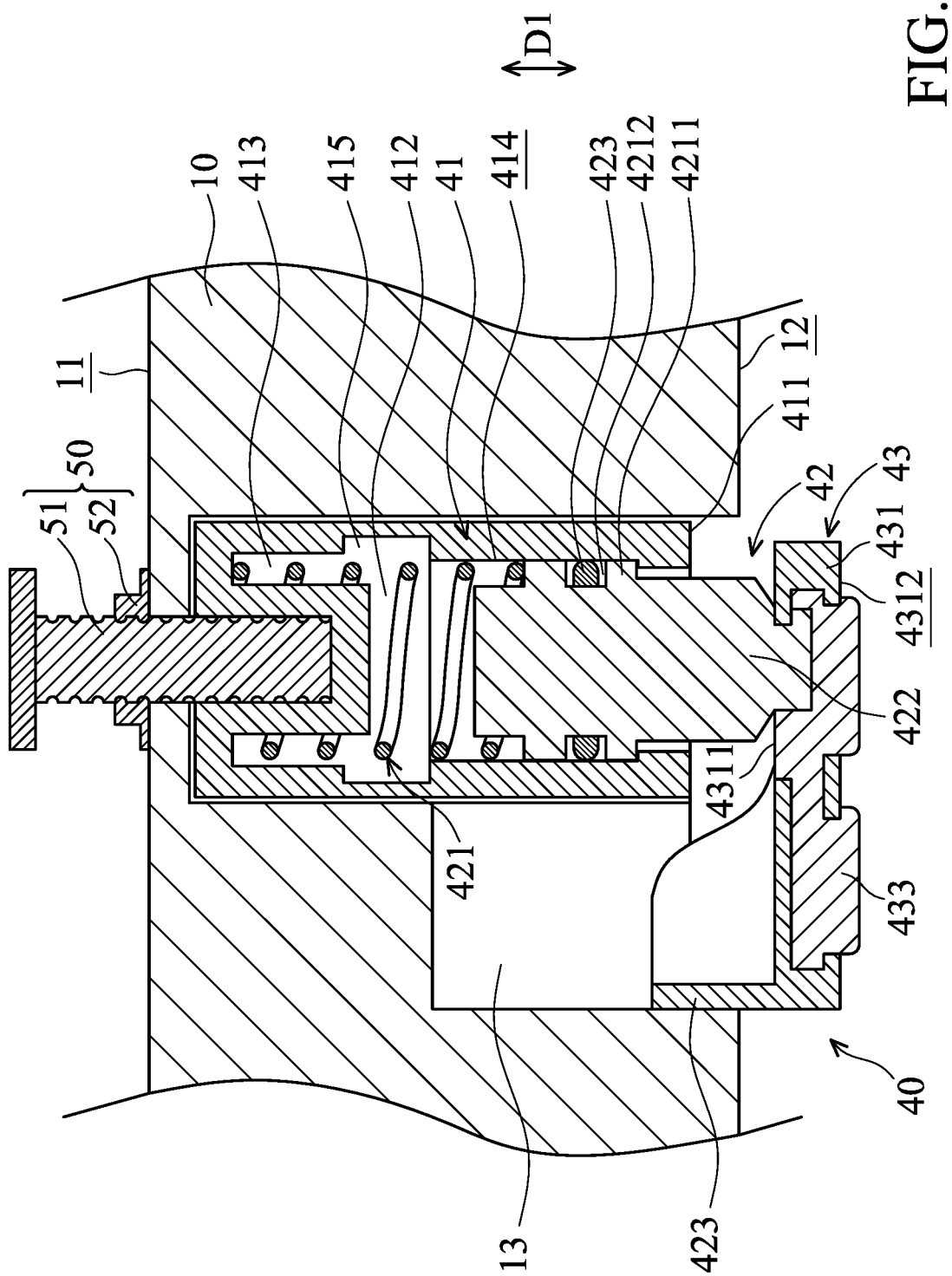
FIG. 3 is a cross-sectional view along line AA of FIG. 2.

FIG. 3 is a cross-sectional view along line AA of FIG. 2. The damping device 40 includes a housing 41, a damping mechanism 42, and a pad 43. The housing 41 is disposed in the receiving groove 13 of the pod base 10. In some embodiments, the housing 41 is fixed in the pod base 10. The housing 41 extends along a moving direction D1. In some embodiments, the moving direction D1 is perpendicular to the pod base 10.

In some embodiments, the housing 41 is fixed in the pod base 10 by a fixing assembly 50. The fixing assembly 50 includes a fixing element 51 and an adjusting element 52. An end of the fixing element 51 passes through the pod base 10 to the receiving groove 13, and is fixed on the housing 41. In some embodiments, the fixing element 51 is a screw. The position of the fixing element 51 relative to the pod base 10 can be adjusted by rotating the fixing element 51.

The adjusting element 52 is disposed on the fixing assembly 50. The adjusting element 52 is configured to fix the position of the fixing element 51 relative to the pod base 10. In some embodiments, the adjusting element 52 is a nut. By adjusting the position of the fixing element 51 relative to the pod base 10, the damping device 40 can be moved along the moving direction D1. Therefore, the damping device 40 can adapt to different thicknesses of the pod bases 10.

The housing 41 has a lower surface 411, a damping groove 412, and a retaining groove 413. The lower surface 411 faces the pad 43. The lower surface 411 is located adjacent to the bottom surface 12 of the pod bases 10 when the elastic element 421 is not compressed. In some embodiments, the lower surface 411 is parallel to the bottom surface 12. The lower surface 411 and the bottom surface 12 of the pod bases 10 are sustainably located at the same plate when the elastic element 421 is not compressed.

The damping groove 412 is formed on the lower surface 411. The damping groove 412 extends along the moving direction D1. The retaining groove 413 is formed on the bottom of the damping groove 412. In some embodiments, the retaining groove 413 is a ring-shaped structure.

The damping mechanism 42 is disposed in the damping groove 412 of the housing 41, and protrudes over the bottom surface 12 of the pod base 10. In some embodiments, the damping mechanism 42 is fixed on the damping groove 412.

The damping mechanism 42 is configured to provide a damping force along the moving direction D1. Therefore, the shock of the wafer container 1 is reduced when the wafer container 1 is impacted, and damage to the wafers W1 in the wafer container 1 due to shock is decreased.

The damping mechanism 42 includes an elastic element 421, a support rod 422, and an O-ring 423. The elastic element 421 is disposed in the damping groove 412. In some embodiments, the elastic element 421 is a spring. The elastic element 421 extends along the moving direction D1, and is configured to be compressed in the moving direction D1.

One end of the elastic element 421 is located in and abuts the retaining groove 413, and the other end of the elastic element 421 abuts the support rod 422. The retaining groove 413 is configured to position the elastic element 421 since the retaining groove 413 is a ring-shaped structure.

The support rod 422 is disposed on the elastic element 421. In some embodiments, the support rod 422 is movably disposed on the elastic element 421. The support rod 422 extends along the moving direction D1. In other words, the support rod 422 can be moved along the moving direction D1.

One end of the support rod 422 protrudes over the housing 41. The other end of the support rod 422 is separated from the bottom of the damping groove 412 when the elastic element 421 is not compressed. In some embodiments, the support rod 422 is made of solid material, such as metal.

In some embodiments, the support rod 422 includes a blocking portion 4211 disposed on the side wall of the support rod 422. The blocking portion 4211 is a ring-shaped structure. The blocking portion 4211 can be blocked by the housing 41, and thus the blocking portion 4211 can prevent the support rod 422 from escaping from the damping groove 412.

The O-ring 423 is disposed on and surrounds the support rod 422. The O-ring 423 is in contact with a side wall 414 of the damping groove 412. The O-ring 423 is a ring-shaped structure. In some embodiments, the support rod 422 has a position groove 4212 formed on the blocking portion 4211, and the O-ring 423 is located in the position groove 4212. In other words, the structure of the blocking portion 4211 is configured to retain the O-ring 423.

The O-ring 423 is made of an elastic material such as rubber. The O-ring 423 is configured to prevent gas in the damping groove 412 from escaping from the damping groove 412. The gas between the bottom of the damping groove 412 and the support rod 422 is configured to provide a damping force. Therefore, the shock of the wafer container 1 is reduced further when the wafer container 1 is impacted, and damage to the wafers W1 in the wafer container 1 due to shock is decreased.

In some embodiments, an addition groove 415 is formed on the side wall 414 of the damping groove 412 between the bottom of the damping groove 412 and the support rod 422 in the moving direction D1. The addition groove 415 is configured to increase the volume of the damping groove 412.

The pad 43 is disposed on the damping mechanism 42. In some embodiments, the pad 43 is fixed on the support rod 422 of the damping mechanism 42. The pad 43 includes a pad base 431, a position element 432, and an elastic pad 433. One end of the support rod 422 is disposed on the top surface 4311 of the pad base 431. In some embodiments, the support rod 422 is fixed on the pad base 431.

The pad base 431 is located over the receiving groove 13 and the bottom surface 12. In other words, the pad base 431 is separated from the bottom surface 12. In some embodiments, the pad base 431 is a plate structure. In some embodiments, the pad base 431 is a rectangle-shaped structure. The pad base 431 extends parallel to the pod base 10.

The position element 432 is disposed on the top surface 4311 of the pad base 431. The top of the position element 432 is located in the receiving groove 13. Therefore, the orientation of the pad 43 can be limited by the position element 432. In some embodiments, the position element 432 is integrally formed with the pad base 431. The position element 432 extends perpendicular to the pad base 431.

The elastic pad 433 is disposed on the bottom surface 4312 of the pad base 431. A portion of the elastic pad 433 protrudes over the bottom surface 4312 of the pad base 431. In some embodiments, a portion of the elastic pad 433 is embedded in the pad base 431. In some embodiments, the elastic pad 433 is made from soft plastic or rubber. The elastic pad 433 further reduces the shock of the wafer container 1, and damage to the wafers W1 in the wafer container 1 due to shock is decreased.

Figure 4:
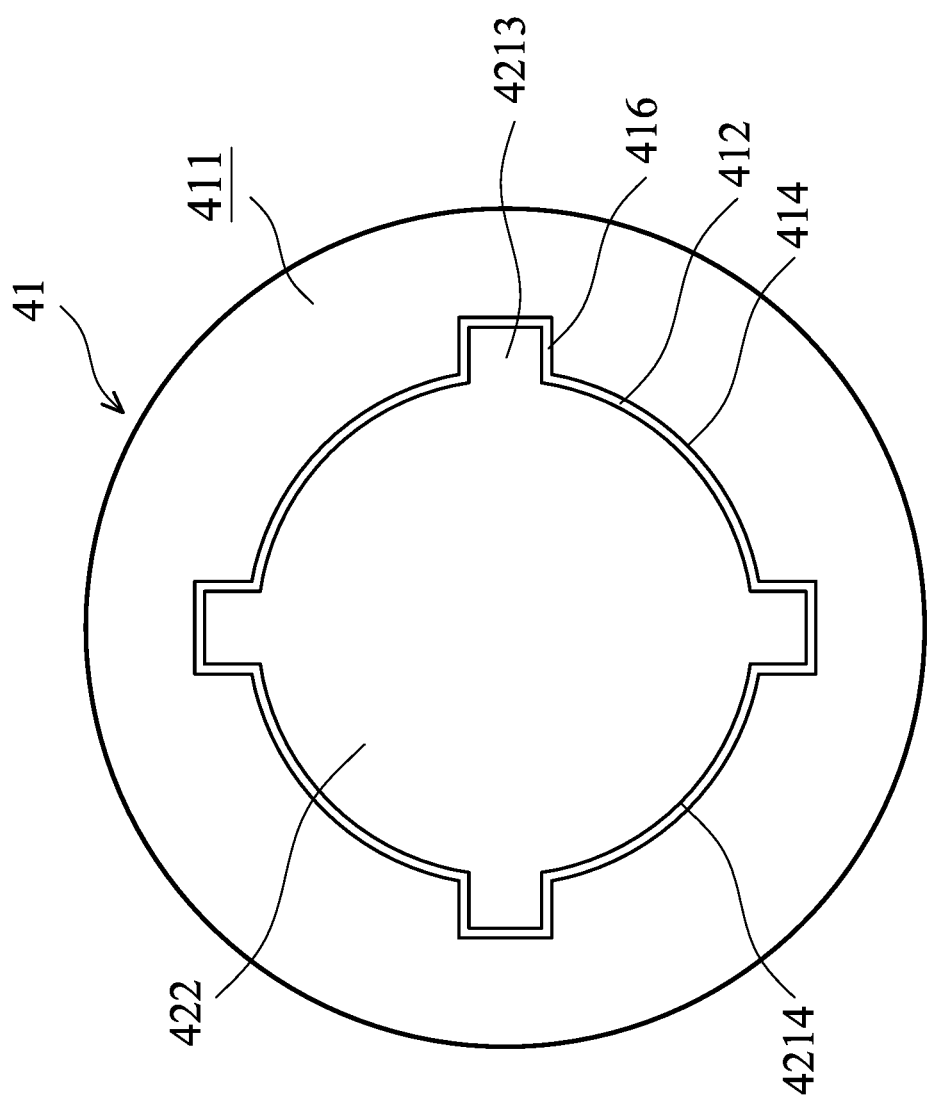
FIG. 4 is a bottom view of the housing and the support rod in accordance with some embodiments of the disclosure.

FIG. 4 is a bottom view of the housing 41 and the support rod 422 in accordance with some embodiments of the disclosure. The housing 41 further includes limitation grooves 416 formed on the side wall 414 of the retaining groove 413. The limitation grooves 416 are separately arranged along the side wall 414 and longitudinally extend to the lower surface 411.

The support rod 422 further includes limitation protrusions 4213 disposed on the side wall 4214 of the support rod 422. The limitation protrusions 4213 is separately arranged along the side wall 4214, and located in the limitation grooves 416. In some embodiments, the limitation protrusions 4213 and the limitation grooves 416 extends perpendicular to the lower surface 411 or along the moving direction D1 shown in FIG. 3. By the structure of the limitation protrusions 4213 and the limitation grooves 416, the rotation of the support rod 422 and the pad 43 can be limited.

Figure 5:
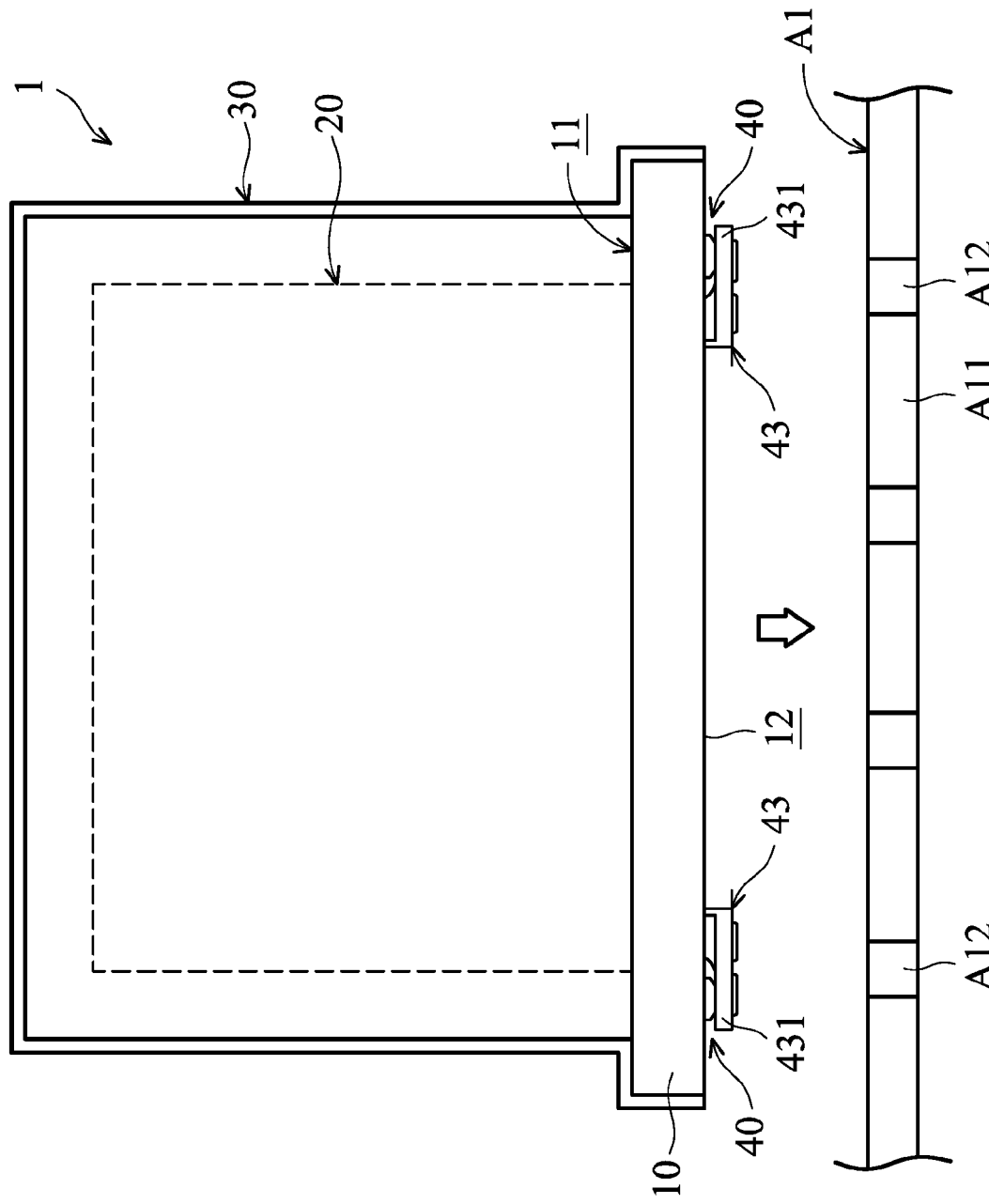
FIG. 5 is a side view of the wafer container in accordance with some embodiments of the disclosure.

FIG. 5 is a side view of the wafer container 1 in accordance with some embodiments of the disclosure. As shown in FIG. 5, the wafer container 1 is moved toward an apparatus A1. In some embodiments, the apparatus A1 is a handcart. The apparatus A1 includes a plate A11 having through holes A12.

As shown in FIG. 5, the pad base 431 of the pad 43 is separated from the bottom surface 12 of the pod base 10 when the damping device 40 is not compressed by the plate A11. After the pad 43 is in contact with the apparatus A1, the damping device 40 starts to provide a damping force opposite to the plate A11.

The damping force is gradually increased as the pad base 431 of the pad 43 is moved toward the bottom surface 12 of the pod base 10. Therefore, the shock of the wafer container 1 is reduced by the damping devices 40, and damage to the wafers W1 in the wafer container 1 due to shock is decreased.

Figure 6:
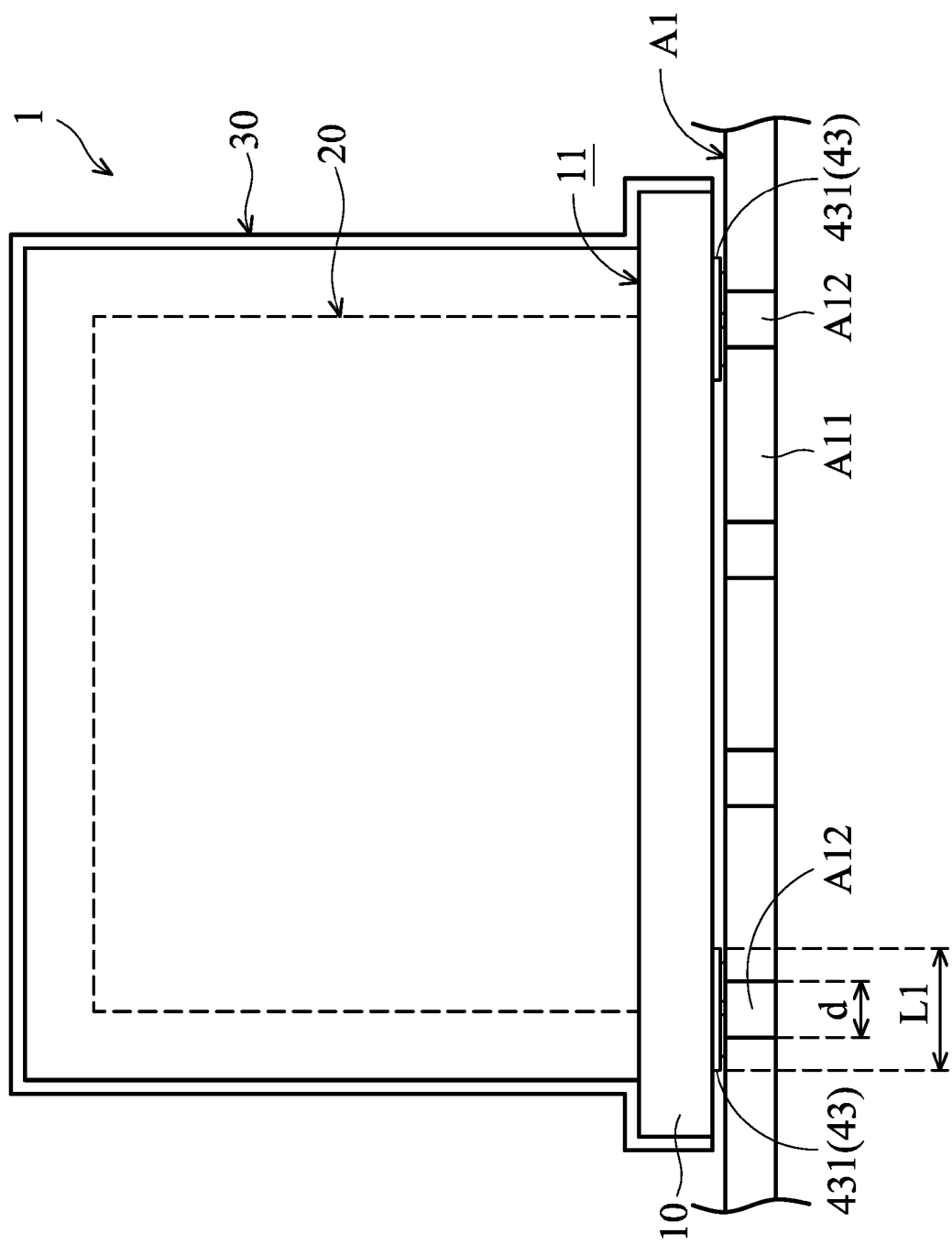
FIG. 6 is a side view of the wafer container moved toward an apparatus in accordance with some embodiments of the disclosure.
Figure 7:
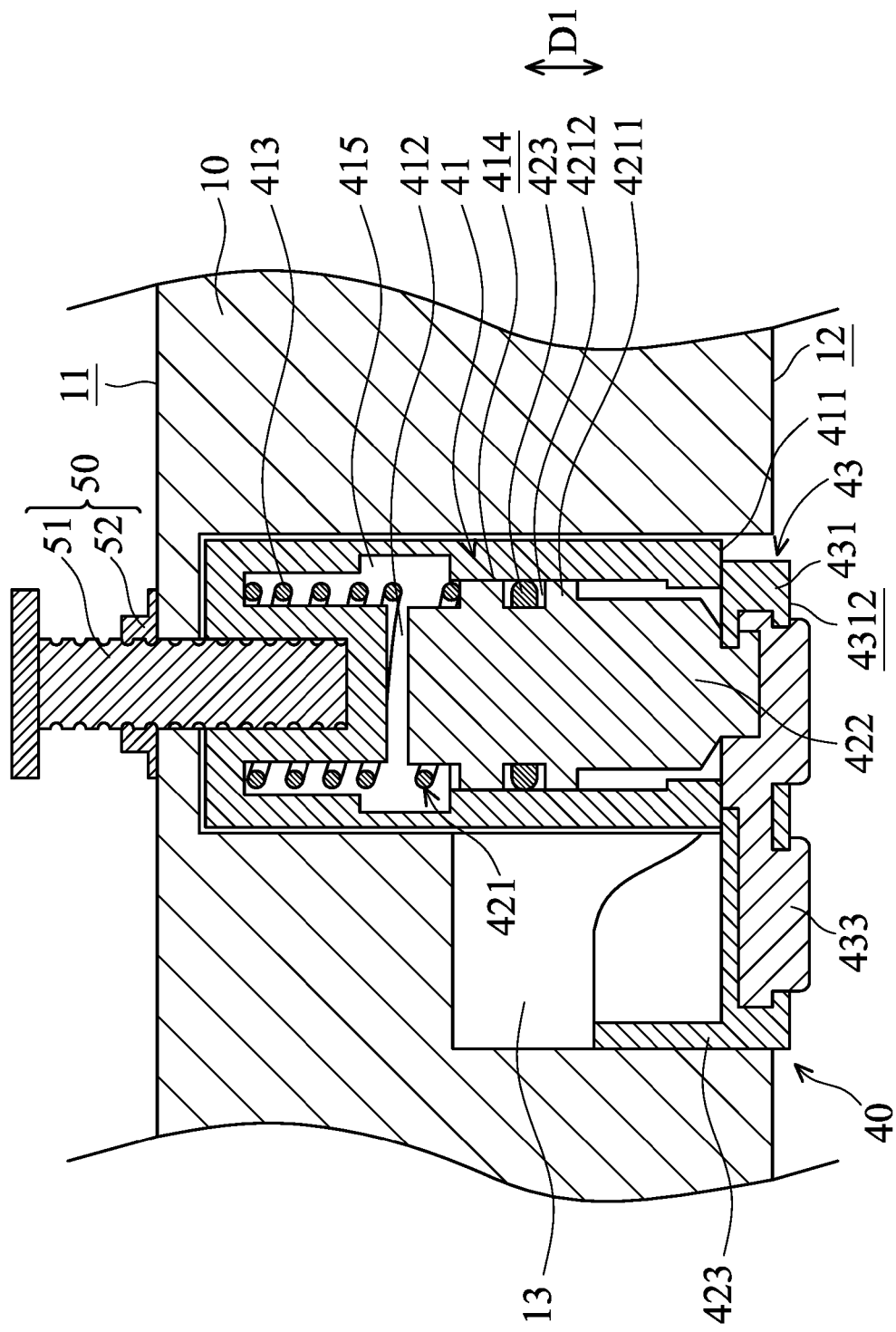
FIG. 7 is a cross-sectional view of the wafer container put on the apparatus in accordance with some embodiments of the disclosure.

FIG. 6 is a side view of the wafer container 1 put on the apparatus A1 in accordance with some embodiments of the disclosure. FIG. 7 is a cross-sectional view of the wafer container 1 put on the apparatus A1 in accordance with some embodiments of the disclosure. After the wafer container 1 is put on the apparatus A1, the pad base 431 of the pad 43 is in contact with the apparatus A1 and the bottom surface 12 of the pod base 10.

In some embodiments, the damping force provided by the damping device 40 is greater than the weight of the wafer container 1. In some embodiments, the damping force provided by the damping device 40 is greater than the weight of the wafer container 1 and the wafers W1 in the wafer container 1. Therefore, the pad base 431 of the pad 43 is separated from the bottom surface 12 of the pod base 10.

In some embodiments, the length L1 of the pad base 431 is greater than the diameter d1 of the hole A12 of the plate A11. Therefore, the damping device 40 is not stuck in the hole A12.

Embodiments of a wafer container with a shock-absorption function are provided. The shock of the wafer container is reduced by the damping devices when the wafer container is put on an apparatus. Therefore, damage to the wafers in the wafer container due to shock is decreased.

In some embodiments, a wafer container is provided. The wafer container includes a pod base having a top surface and a bottom surface, a cassette disposed on the top surface, and a damping device, disposed on the bottom surface. The damping device includes a housing disposed in the pod base, and a damping mechanism disposed in the housing and protruding over the bottom surface. The damping mechanism is configured to provide a damping force.

In some embodiments, a wafer container is provided. The wafer container includes a pod base having a bottom surface and a receiving groove formed on the bottom surface. The wafer container further includes a damping device including a housing disposed in the receiving groove and having a damping groove, and a damping mechanism disposed in the damping groove and protruding over the bottom surface. The damping mechanism is configured to provide a first damping force.

In some embodiments, a wafer container is provided. The wafer container includes a pod base having a bottom surface and a receiving groove formed on the bottom surface. The wafer container further includes a damping device including a housing disposed in the receiving groove and having a damping groove, an elastic element disposed in the damping groove, and a support rod disposed on the elastic element. An end of the elastic element abuts a bottom of the damping groove and another end of the elastic element abuts the support rod, and an end of the support rod protrudes over the housing. The damping device further includes an O-ring that is disposed on the support rod, and the O-ring is in contact with a side wall of the damping groove.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer container, comprising:
   a pod base having a top surface and a bottom surface opposite the top surface;
   a cassette disposed over and abutting the top surface; and
   a damping device, disposed on the bottom surface, comprising:
   a housing disposed in the pod base; and
   a damping mechanism, disposed in the housing, protruding over the bottom surface, wherein the damping mechanism is configured to provide a damping force.

2. The wafer container as claimed in claim 1, wherein the damping mechanism comprises an elastic element disposed in the housing, and a support rod disposed on the elastic element, wherein the support rod protrudes over the housing.

3. The wafer container as claimed in claim 2, wherein the damping mechanism comprises an O-ring disposed on the support rod, in contact with the housing.

4. The wafer container as claimed in claim 1, further comprising a pad disposed on the damping mechanism.

5. The wafer container as claimed in claim 4, wherein the pod base comprises a receiving groove formed on the bottom surface, and the pad comprises:
   a pad base disposed on the damping mechanism and located over the receiving groove; and
   a position element disposed on the pad base and located in the receiving groove.

6. The wafer container as claimed in claim 5, wherein the pad comprises an elastic pad disposed on the pad base.

7. The wafer container as claimed in claim 1, further comprising a pod shell, detachably disposed on the top surface, covering the cassette.

8. A wafer container, comprising:
   a pod base having a top surface and a bottom surface opposite the top surface, and a receiving groove is formed in the bottom surface;
   a cassette disposed on and abutting the top surface; and
   a damping device, comprising:
   a housing, disposed in the receiving groove, having a damping groove; and
   a damping mechanism, disposed in the damping groove, protruding over the bottom surface, wherein the damping mechanism is configured to provide a first damping force.

9. The wafer container as claimed in claim 8, wherein the damping mechanism comprises an elastic element disposed in the damping groove, and a support rod disposed on the elastic element, wherein an end of the support rod protrudes over the housing.

10. The wafer container as claimed in claim 9, wherein the damping mechanism comprises an O-ring disposed on the support rod, in contact with a side wall of the damping groove, wherein the O-ring is configured to prevent gas in the damping groove from escaping from the damping groove, and the gas between a bottom of the damping grove and the support rob is configured to provide a second damping force.

11. The wafer container as claimed in claim 10, wherein the support rod has a position groove, and the O-ring is located in the position groove.

12. The wafer container as claimed in claim 9, further comprising a pad comprising:
    a pad base, disposed on the support rod, located over the receiving groove; and
    a position element disposed on the pad base and located in the receiving groove.

13. The wafer container as claimed in claim 12, wherein the pad further comprises a elastic pad disposed on the pad base.

14. The wafer container as claimed in claim 8, further comprising:
    a pod shell, detachably disposed on the top surface of the pod base, covering the cassette.

15. A wafer container, comprising:
    a pod base having a bottom surface and a receiving groove formed on the bottom surface;
    a damping device, comprising:
    a housing, disposed in the receiving groove, having a damping groove;
    an elastic element disposed in the damping groove;
    a support rod disposed on the elastic element, wherein an end of the elastic element abuts a bottom of the damping groove and another end of the elastic element abuts the support rod, and an end of the support rod protrudes over the housing;
    an O-ring, disposed on the support rod, in contact with a side wall of the damping groove.

16. The wafer container as claimed in claim 15, wherein the support rod has a position groove, and the O-ring is located in the position groove.

17. The wafer container as claimed in claim 16, further comprising a pad comprising:
    a pad base, disposed on the support rod, located over the receiving groove; and
    a position element disposed on the pad base and located in the receiving groove.

18. The wafer container as claimed in claim 17, wherein the pad further comprises a elastic pad disposed on the pad base.

19. The wafer container as claimed in claim 15, further comprising a cassette, disposed on a top surface of the pod base.

20. The wafer container as claimed in claim 19, further comprising a pod shell, detachably disposed on the top surface of the pod base, covering the cassette.

* * * * *